(12) United States Patent
Chen et al.

(10) Patent No.: US 9,350,158 B2
(45) Date of Patent: May 24, 2016

(54) OVER-CURRENT PROTECTION CIRCUIT AND PULSE WIDTH MODULATOR HAVING THE SAME

(71) Applicant: ANPEC ELECTRONICS CORPORATION, Hsinchu (TW)

(72) Inventors: Chih-Yuan Chen, Hsinchu (TW); Hsiang-Chung Chang, Hsinchu County (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 161 days.

(21) Appl. No.: 14/318,625

(22) Filed: Jun. 28, 2014

(65) Prior Publication Data
US 2015/0288166 A1   Oct. 8, 2015

(30) Foreign Application Priority Data
Apr. 7, 2014 (TW) ............... 103112679 A

(51) Int. Cl.
*H02H 3/093* (2006.01)
*H02H 7/12* (2006.01)

(52) U.S. Cl.
CPC ........... *H02H 3/0935* (2013.01); *H02H 7/1213* (2013.01)

(58) Field of Classification Search
CPC ................ H02H 3/0935; H02H 7/1213
USPC ............................................. 361/94
See application file for complete search history.

(56) References Cited

U.S. PATENT DOCUMENTS

| | | | |
|---|---|---|---|
| 6,246,220 B1 * | 6/2001 | Isham | H02M 3/1588 323/224 |
| 2009/0034302 A1 * | 2/2009 | Cannella | H02M 1/32 363/56.1 |

* cited by examiner

*Primary Examiner* — Thienvu Tran
*Assistant Examiner* — Kevin J Comber
(74) *Attorney, Agent, or Firm* — Li & Cai Intellectual Property (USA) Office

(57) ABSTRACT

An over-current protection circuit and a pulse width modulator having the same are provided. The pulse width module includes a high-side switch, a low-side switch, and a driving module. The driving module controls the high-side switch and the low-side switch according to a set signal and a reset signal periodically to adjust an inductive current flowing through the high-side switch and the low-side switch. When inductive current is the overcurrent during the minimum on time of the high-side switch, the over-current protection circuit turns off the high-side switch in a predefined time to decrease the inductive current continuously, so that the average current of the inductive current does not become too high to damage the pulse width module.

18 Claims, 7 Drawing Sheets

OVER-CURRENT PROTECTION CIRCUIT AND PULSE WIDTH MODULATOR HAVING THE SAME

BACKGROUND

1. Technical Field

The present disclosure relates to an over-current protection circuit and pulse width modulator having the same, and in particular, to an over-current protection circuit, and a pulse width modulator having the same, capable of preventing from overcurrent during turn-on of the high-side switch.

2. Description of Related Art

Generally speaking, a pulse width modulator is a DC-DC voltage converter, and modulates the inputted dc voltage to a voltage level by stepping, so as to provide a stable load voltage to peripheral elements.

Please refer to FIG. 1 which is a schematic view of a pulse width modulator in the prior art. As shown in FIG. 1, a pulse width modulator 10 comprises an output-stage element 11, a trigger 13 and a driving module. The driving module comprises a feedback element 12, a minimum-on-time element 14, a judging element 15, a control element 16, a high-side overcurrent detecting element 17 and a current sensing element 18. The output-stage element 11 is operated under a power source VCC, and the output-stage element 11 comprises a high-side switch US, a low-side switch LS, an inductor L and a capacitor C. One end of the high-side switch US is connected electrically to an input end for receiving the power source VCC. Another end of the high-side switch US is connected electrically to one end of the low-side switch LS for forming a connection node SW. Another end of the low-side switch LS is grounded. One end of the inductor L is connected electrically to the connection node SW, and another end of the inductor L is connected electrically to an output end for outputting a load voltage VOUT. One end of the capacitor C and one end of the feedback element 12 are connected electrically between the inductor L and the output end. Another end of the capacitor C and another end of the feedback element 12 are grounded. The feedback element 12 is a voltage divider circuit to detect the load voltage VOUT and generate a feedback signal FB to the judging element 15 correspondingly.

The trigger 13 is configured for receiving a pulse signal CLK to generate a set signal SET to the control element 16 periodically. The high-side current sensing element 18 is connected electrically to the input end and the connection node SW to sense the inductive current IL flowing through the high-side switch US which is drawn in solid line, and transmit the result of sensing the inductive current IL flowing through the high-side switch US (i.e., the solid line) to the high-side overcurrent detecting element 17 and the judging unit 15. The high-side overcurrent detecting element 17 judges whether the inductive current IL flowing through the high-side switch US (i.e., the solid line) has the overcurrent, and generates a high-side overcurrent signal HS_OCP to the judging element 15 when the high-side overcurrent detecting element 17 judges that the inductive current IL flowing through the high-side switch US (i.e., the solid line) has the overcurrent.

The judging element 15 generates a pulse width signal DUTY according to the feedback signal FB and the result of sensing the inductive current IL flowing through the high-side switch US (i.e., the solid line), to adjust the duty cycle of the high-side switch US and the low-side switch LS correspondingly. The judging element 15 generates a reset signal RESET according to the pulse width signal DUTY and the high-side overcurrent signal HS_OCP. Therefore, the control element 16 can generate a high-side turn-on signal UGON and a low-side turn-on signal LGON according to the set signal SET and the reset signal RESET, to periodically control the high-side switch US and the low-side switch LS, to turn on or off the high-side switch US, and turn on or off the low-side switch, so as to adjust the inductive current IL flowing through the high-side switch US which is drawn in the solid line, and the inductive current IL flowing through the low-side switch LS which is drawn in the dashed line.

However, a parasitic inductance exists at the connection node SW after the high-side switch US is turned on for a period, and it causes the ringing effect to be generated in the voltage of the connection node SW. When the current sensing element 18 senses the inductive current IL after turn-on of the high-side switch US for a period, the current sensing element 18 will sense the wrong inductive current IL. In general control systems, blanking is utilized to avoid the ringing effect, so as to prevent the high-side overcurrent detecting element 17 from receiving the wrong inductive current IL and misjudging. In practice, a minimum-on-time element 14 is added to the pulse width modulator 10 in the prior art. The minimum-on-time element 14 receives the pulse signal CLK, to periodically generate a minimum on time MINTON which corresponds to the period after the high-side switch US has been turned on, so that the turn-on of the high-side switch US can be maintained for the minimum on time MINTON after the control element 16 turns on the high-side switch US.

The minimum-on-time element 14 controls the current sensing element 18 according to the high-side turn-on signal UGON, during which the high-side switch US is turned on within the minimum on time MINTON to prevent the control element 16 from being affected by the high-side overcurrent signal HS_OCP and the pulse width signal DUTY, to turn off the high-side switch US, for example, the reset signal RESET is maintained at low level during the minimum on time MINTON. Therefore, the high-side overcurrent detecting element 17 is prevented from receiving the wrong inductive current IL and making the high-side switch US act mistakenly. After the minimum on time MINTON, the current sensing element 18 senses whether the inductive current IL is larger than an overcurrent level LEV_OCP as shown in FIG. 2, to provide the sensing result to the high-side overcurrent detecting element 17 for judging whether the inductive current IL has the overcurrent. The high-side overcurrent detecting element 17 generates the high-side overcurrent signal HS_OCP when the inductive current IL is detected to be larger than the overcurrent level LEV_OCP.

Please refer to both of FIG. 1 and FIG. 2, the FIG. 2 is a signal waveform of the pulse width modulator in prior art. Based on the structure of the pulse width modulator 10 in prior art, within time T1, the inductive current IL is larger than the overcurrent level LEV_OCP, and the high-side switch US is turned on within the minimum on time MINTON. The current sensing element 18 does not generate the high-side overcurrent signal HS_OCP, so the inductive current IL increases continuously. Next, within time T2, high side current sense function is enabled. The overcurrent of high-side is detected and the current sensing element 18 generates the high-side overcurrent signal HS_OCP to make the inductive current IL decrease. Within time T3-T4 and time T5-T6, the current sensing element 18 also repeats the operation within the time T1-T2, respectively.

However, the increasing speed of the inductive current IL of the pulse width modulator 10 is faster than decreasing speed and the high-side switch US is not turned off within the minimum on time MINTON. Therefore, the inductive current IL still increases continuously even if the inductive current IL is the overcurrent within the minimum on time MINTON such as time T1, T3 and T5, so that the average current of the inductive current IL increases gradually as time goes on, such as the average current of the inductive current IL within time T1-T6. Moreover, when the output voltage is too low that the output is judged to be shorted to ground, an under voltage protection component in the pulse width modulator 10, which is not shown in the figure, usually generates an under voltage protection signal UVP to make the inductive current IL decrease continuously, such as the under voltage protection signal UVP within time T1-T6. Therefore, if the inductive current IL in the pulse width modulator 10 becomes too high before the under voltage protection signal UVP is generated, for example, the inductive current IL increases to the position P, the pulse width modulator 10 may be burned out.

SUMMARY

An exemplary embodiment of the present disclosure provides an over-current protection circuit and a pulse width modulator having the same which can decrease an inductive current when the inductive current is the overcurrent during the minimum on time of the high-side switch, so that the average current of the inductive current does not become too high to damage the pulse width modulator.

According to one exemplary embodiment of the present disclosure, an over-current protection circuit adapted for a pulse width modulator is provided. The pulse width module comprises a trigger, a high-side switch, a low-side switch, a driving module and a control element. The trigger is configured for receiving a clock signal to generate a set signal to the driving module periodically. The high-side switch is connected electrically to the low-side switch. The driving module controls the high-side switch and the low-side switch according to the set signal and a reset signal periodically to adjust an inductive current flowing through the high-side switch and the low-side switch. The control element is configured for turning on the high-side switch for at least one minimum on time, and after the minimum on time the control element detects whether the inductive current flowing through the high-side switch is larger than an overcurrent level. The control element generates an overcurrent signal when the inductive current is detected larger than the overcurrent level. The over-current protection circuit further comprises a first pulse generator, a counting unit, and an overcurrent judging unit. The first pulse generator is configured for receiving a clock signal to generate a judging signal periodically, and a judging time of the judging signal is larger than the minimum on time. The counting unit is configured for receiving the judging signal. The overcurrent judging unit is configured for receiving the judging signal and the overcurrent signal to control whether the trigger outputs the set signal. When the overcurrent judging unit judges that the inductive current to be overcurrent according to the judging signal and the overcurrent signal, the overcurrent judging unit stops the trigger outputting the set signal to the driving module, and the counting unit counts for a predefined time according to the judging signal. After the counting unit finishes counting for the predefined time, the overcurrent judging unit permits the trigger to output the set signal to the driving module periodically.

An exemplary embodiment of the present disclosure provides a pulse width modulator having an over-current protection, and the pulse width modulator comprises a trigger, a high-side switch, a low-side switch, a driving module and an over-current protection circuit. The trigger is configured for receiving a clock signal to generate a set signal to the driving module periodically. The high-side switch is connected electrically to the low-side switch. The driving module controls the high-side switch and the low-side switch according to the set signal and a reset signal periodically to adjust an inductive current flowing through the high-side switch and the low-side switch. The driving module is configured for turning on the high-side switch for at least one minimum on time. After the minimum on time, the driving module detects whether the inductive current flowing through the high-side switch is larger than an overcurrent level. The driving module generates an overcurrent signal when the inductive current is detected larger than the overcurrent level. The over-current protection circuit further comprises a first pulse generator, a counting unit, and an overcurrent judging unit. The first pulse generator is configured for receiving a clock signal to generate a judging signal periodically, and a judging time of the judging signal is larger than the minimum on time. The counting unit is configured for receiving the judging signal. The overcurrent judging unit is configured for receiving the judging signal and the overcurrent signal to control whether the trigger outputs the set signal. When the overcurrent judging unit judges that the inductive current to be overcurrent according to the judging signal and the overcurrent signal, the overcurrent judging unit stops the trigger outputting the set signal to the driving module, and the counting unit counts for a predefined time according to the judging signal. After the counting unit finishes counting for the predefined time, the overcurrent judging unit permits the trigger to output the set signal to the driving module periodically.

An exemplary embodiment of the present disclosure provides another over-current protection circuit which is adapted for a pulse width modulator. The pulse width module includes a trigger, a high-side switch, a low-side switch and a control element. The trigger is configured for receiving a clock signal to generate a set signal to the control element periodically. The high-side switch is connected electrically to the low-side switch. The control element controls the high-side switch and the low-side switch according to the set signal and a reset signal and periodically adjusts an inductive current flowing through the high-side switch and the low-side switch. The control element is configured for turning on the high-side switch for at least one minimum on time. After the minimum on time, the control element detects whether the inductive current flowing through the low-side switch is larger than an overcurrent level. The control element generates an overcurrent signal when the inductive current is detected larger than the overcurrent level. The over-current protection circuit comprises a counting unit and an overcurrent judging unit. The counting unit is configured for receiving the clock signal. The overcurrent judging unit is configured for receiving a low-side turn-on signal indicative of turning on the low-side switch and receiving the overcurrent signal to control whether the trigger outputs the set signal. When the overcurrent judging unit judges that the inductive current to be overcurrent according to the low-side turn-on signal and the overcurrent signal, the overcurrent judging unit stops the trigger outputting the set signal to the driving module, and the counting unit counts for a predefined time according to the clock signal. After the counting unit finishes counting for the predefined time, the overcurrent judging unit permits the trigger to output the set signal to the driving module periodically.

An exemplary embodiment of the present disclosure provides a pulse width modulator having an over-current protection, and the pulse width modulator comprises a trigger, a high-side switch, a low-side switch, a control element, and an over-current protection circuit. The trigger is configured for receiving a clock signal to generate a set signal to the control element periodically. The high-side switch is connected electrically to the low-side switch. The control element controls the high-side switch and the low-side switch according to the set signal and a reset signal to periodically adjust an inductive current flowing through the high-side switch and the low-side switch. The control element is configured for turning on the high-side switch for at least one minimum on time. After the minimum on time, the control element detects whether the inductive current flowing through the low-side switch is larger than an overcurrent level. The control element generates an overcurrent signal when the inductive current flowing through the low-side switch is detected larger than the overcurrent level. The over-current protection circuit comprises a counting unit and an overcurrent judging unit. The counting unit is configured for receiving the clock signal. The overcurrent judging unit is configured for receiving a low-side turn-on signal indicative of turning on the low-side switch and receiving the overcurrent signal, to control whether the trigger outputs the set signal. When the overcurrent judging unit judges that the inductive current to be overcurrent according to the low-side turn-on signal and the overcurrent signal, the overcurrent judging unit stops the trigger outputting the set signal to the driving module, and the counting unit counts for a predefined time according to the clock signal. After the counting unit finishes counting for the predefined time, the overcurrent judging unit permits the trigger to output the set signal to the driving module periodically.

In summary, the over-current protection circuit and a pulse width modulator having the same provided by the exemplary embodiments of the present disclosure will turn off the high-side switch for a predefined time to continuously decrease an inductive current when the inductive current is the overcurrent during the minimum on time of the high-side switch, so that the average current of the inductive current does not become too high to damage the pulse width modulator.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention that they be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
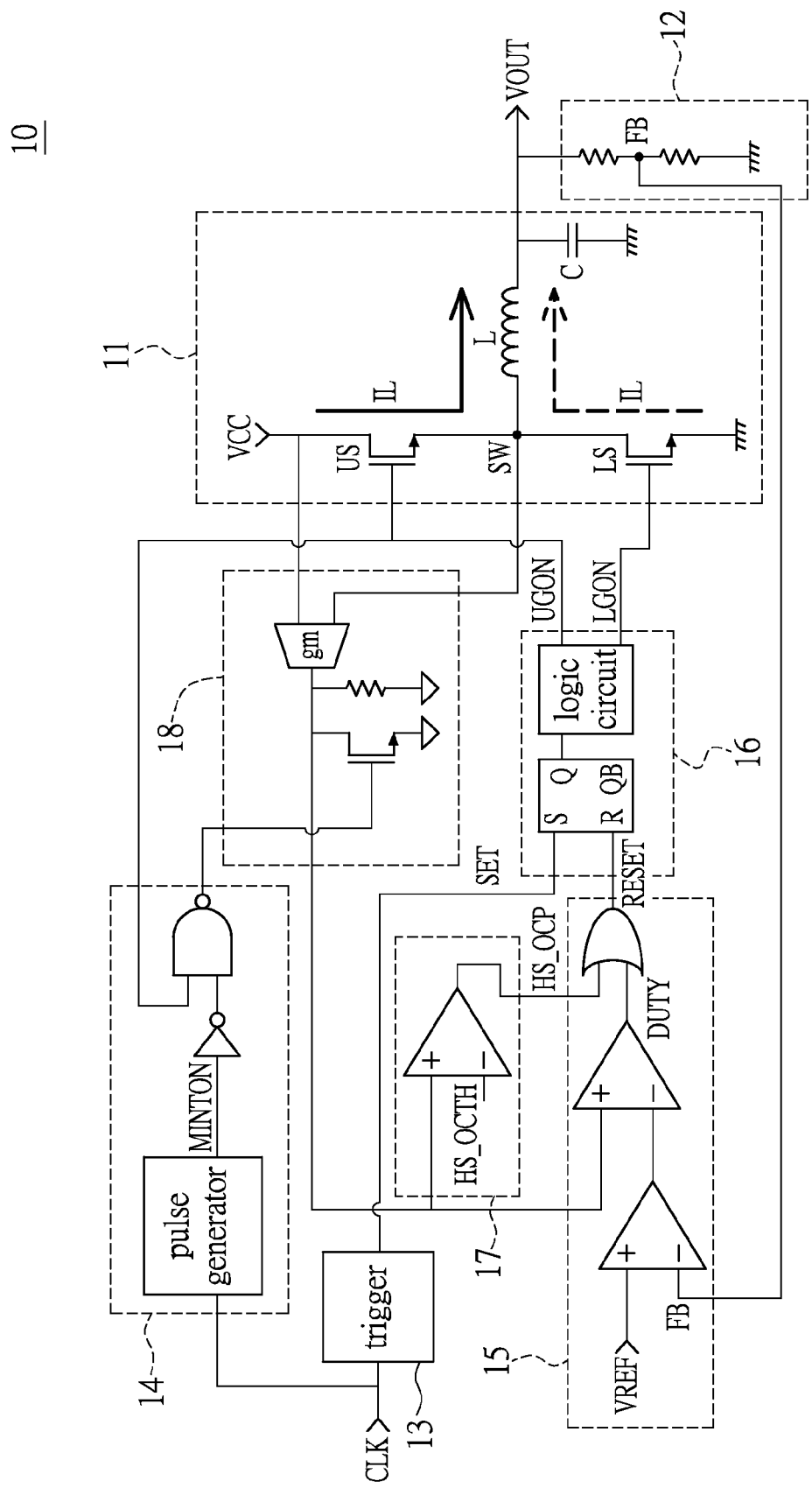
FIG. 1 is a schematic view of a pulse width modulator in prior art.

Reference will now be made in detail to the exemplary embodiments of the present disclosure, examples of which are illustrated in the accompanying drawings. However, they may be embodied in different forms and should not be construed as limited to the embodiments set forth herein. Wherever possible, the same reference numbers are used in the drawings and the description to refer to the same or like parts.

Figure 2:
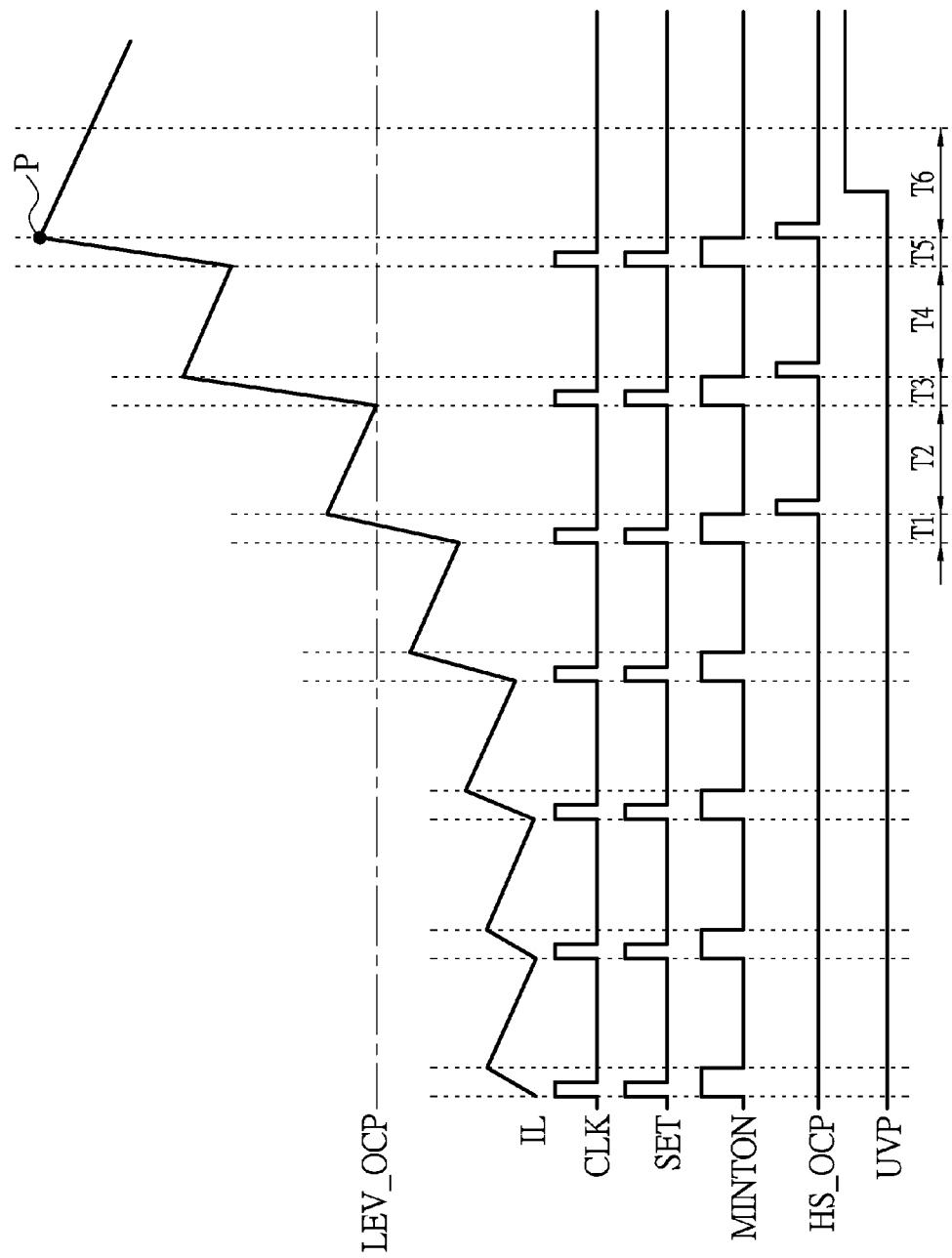
FIG. 2 is a signal waveform of the pulse width modulator in prior art.
Figure 3:
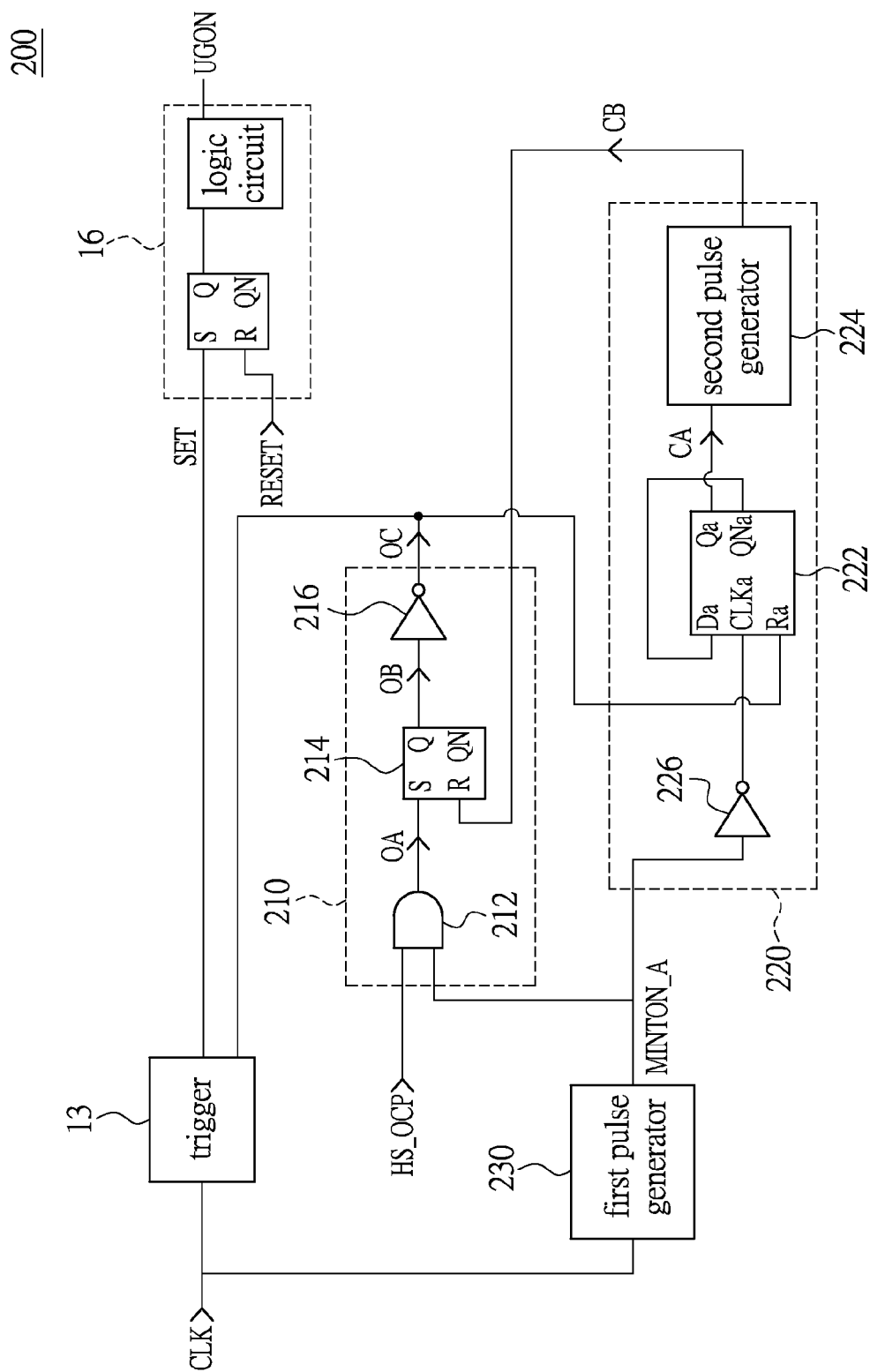
FIG. 3 is a schematic view of an exemplary embodiment of an over-current protection circuit of the present disclosure.

Based on the circuit structure and driving way of the pulse width modulator 10 in the prior art, please refer to both FIG. 1 and FIG. 3, and FIG. 3 is a schematic view of an exemplary embodiment of an over-current protection circuit of the present disclosure. The current protection circuit 200 is adapted for the pulse width modulator 10. The connection relationships and operations among the output-stage element 11, the trigger 13 and the driving module of the pulse width modulator 10 are illustrated in the prior art, FIG. 1 and FIG. 2, so their detailed description is omitted.

In this exemplary embodiment, the trigger 13 is configured for receiving a clock signal CLK to generate a set signal SET to the control element 16 of the driving module periodically. When the control element 16 receives the set signal SET, the control element 16 generates a high-side turn-on signal UGON indicative of high level to turn on the high-side switch US, so as to make the inductive current IL increase. When the control element 16 receives the reset signal RESET, the control element 16 generates a high-side turn-on signal UGON indicative of low level to turn off the high-side switch US, so as to make the inductive current IL decrease. The control element 16 of the driving module comprises a SR latch and a logic circuit. The SR latch is connected electrically to the logic circuit, and generates a high-side turn-on signal UGON by the logic circuit according to the set signal SET and the reset signal RESET, in order to turn on or turn off the high-side switch US. The trigger 13 of this exemplary embodiment may be a positive edge-triggered circuit or a negative edge-triggered circuit. The trigger 13 also may be another kind of trigger, and the present disclosure is not limited thereto.

It is noted that the over-current protection circuit 200 has an overcurrent judging unit 210, a counting unit 220 and a first pulse generator 230. The first pulse generator 230 receives a clock signal CLK to generate a judging signal MINTON_A periodically. Besides, a judging time of the judging signal MINTON_A is larger than a minimum on time MINTON. In this exemplary embodiment, the judging time of the judging signal MINTON_A indicates the time that the judging signal MINTON_A is maintained at high level continuously, such as the judging signal MINTON_A shown in FIG. 4. The first pulse generator 230 transmits the judging signal MINTON_A to the overcurrent judging unit 210 and the counting unit 220.

The counting unit 220 is connected electrically to the first pulse generator 230, and receives the judging signal MINTON_A. The overcurrent judging unit 210 is also connected electrically to the first pulse generator 230, and receives the judging signal MINTON_A and the high-side overcurrent signal HS_OCP, to control whether the trigger 13 outputs the set signal SET to the control element 16. When the overcurrent judging unit 210 judges that the inductive current IL to be overcurrent according to the judging signal MINTON_A and the high-side overcurrent signal HS_OCP, the overcurrent judging unit 210 stops the trigger 13 outputting the set signal SET to the control element 16, and the counting unit 220 counts for a predefined time according to the judging signal MINTON_A. After the counting unit 220 finishes counting for the predefined time, the overcurrent judging unit 210 permits the trigger 13 to output the set signal SET to the control element 16 periodically.

That is, when the overcurrent judging unit 210 judges that the inductive current IL to be overcurrent according to the judging signal MINTON_A and the high-side the overcurrent signal HS_OCP, the overcurrent judging unit 210 will stop the trigger 13 outputting the set signal SET to the control element 16. In this disclosure, the control element 16 outputs a high-side turn-on signal UGON with low level, to turn off the high-side switch US, so as to make the inductive current IL continuously decrease. After the counting unit 220 finishes counting for the predefined time, that is, after the inductive current IL decreases for a predefined time, the overcurrent judging unit 210 permits the trigger 13 to generate the set signal SET to the control element 16 periodically.

In this exemplary embodiment, the overcurrent judging unit 210 comprises an AND gate 212, a latch 214 and a first NOT gate 216. The AND gate 212 receives a judging signal MINTON_A and a high-side overcurrent signal HS_OCP to generate an activating signal OA correspondingly. The latch 214 is connected electrically between the AND gate 212 and the first NOT gate 216, to generate a latch signal OB according to the activating signal OA. The first NOT gate 216 receives the latch signal OB, to generate an on/off signal OC to the trigger 13 and the counting unit 220, and further to control whether the trigger 13 outputs the set signal SET to the control element 16, and to control whether the counting unit 220 starts counting for a predefined time according to the judging signal MINTON_A.

In this exemplary embodiment, the latch 214 is a SR latch. Therefore, when the AND gate 212 receives the judging signal MINTON_A with high level and the high-side overcurrent signal HS_OCP with high level, it means that the inductive current IL has the overcurrent, the AND gate 212 generates the activating signal OA with high level to a set end of the SR latch, to generate a latch signal OB with high level correspondingly. Next, the first NOT gate 216 inverts the latch signal OB with high level, and outputs the on/off signal OC with low level to the trigger 13 and the counting unit 220. In this disclosure, the trigger 13 does not output the set signal SET to the control element 16, so as to turn off the high-side switch US and make the inductive current IL continuously decrease. After the counting unit 220 finishes counting for the predefined period, that is, after the inductive current IL decreases for a predefined period, the counting unit 220 transmits a signal to a reset end of the SR latch, to make the first NOT gate 216 output the on/off signal OC with high level, to permit the trigger 13 to output the set signal SET to the control element 16 periodically. The latch 214 can also be another kind of latch, such as JK flip-flop; however, the present disclosure is not limited thereto.

The counting way of the counting unit 220 can be designed such that the counting unit 220 outputs a restoring signal CB after waiting for a predefined time, to notice the overcurrent judging unit 210 that the counting is terminated; alternatively, the counting way of the counting unit 220 can be designed such that the counting unit 220 outputs the restoring signal CB after counting the judging signal for several periods, to notice the overcurrent judging unit 210 that the counting is terminated. The counting unit 220 can be operated in other counting way, and the present disclosure is not limited thereto. In this exemplary embodiment, after counting the judging signal for one period, the counting unit 220 outputs a restoring signal according to the circuit design, and the detail is described in the following paragraph.

The counting unit 220 comprises a D flip-flop 222, a second pulse generator 224 and a second NOT gate 226. The D flip-flop 222 has an input end Da, a clock input end CLKa, a reset end Ra, an output end Qa and an inverting output end QNa. As shown in FIG. 3, the clock input end CLKa is connected electrically to the second NOT gate 226. The input end Da is connected electrically to the inverting output end QNa. The output end Qa is connected electrically to the second pulse generator 224. The reset end Ra is connected electrically to the first NOT gate 216.

According to the connecting relationship between the D flip-flop 222, the second pulse generator 224 and second NOT gate 226, the second NOT gate 226 receives and inverts the judging signal MINTON_A. The D flip-flop 222 receives the inverted judging signal MINTON_A, to count the judging signal MINTON_A for one period according to the on/off signal OC and amount of the D flip-flop and generates the count terminating signal CA after the D flip-flop 222 counts the judging signal MINTON_A for one period. The amount of the D flip-flop is one in this exemplary embodiment.

The second pulse generator 224 receives the count terminating signal CA to generate a restoring signal CB to the latch 214 correspondingly. It makes the first NOT gate 216 generate the on/off signal OC to the trigger 13, to permit the trigger 13 to output the set signal SET to the control element 16 periodically, and the high-side switch US is further controlled to turn on or turn off. In this exemplary embodiment, the amount of the D flip-flop can be provided according to practical condition. For example, if there are two D flip-flops 222, the D flip-flops 222 will generate the count terminating signal CA after counting the judging signal MINTON_A for two periods. However, the present disclosure is not limited thereto.

Figure 4:
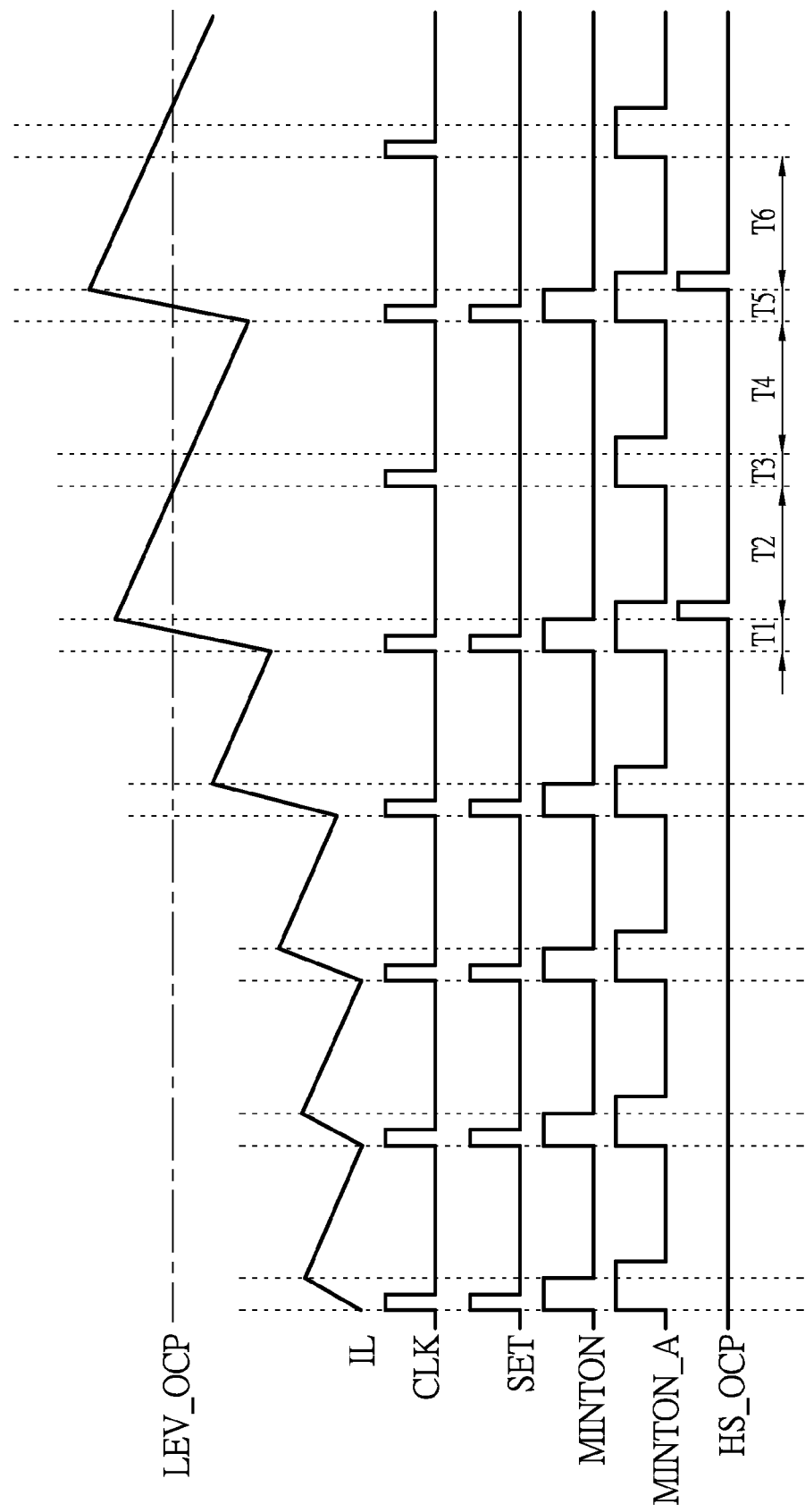
FIG. 4 is a signal waveform of the over-current protection circuit shown in the FIG. 3.

Next, please refer to FIG. 4 which is a waveform of the over-current protection circuit shown in the FIG. 3. As shown in FIG. 4, within time T1, the high-side switch US is turned on during the minimum on time MINTON, so the inductive current IL increases continuously, and will be larger than the overcurrent level LEV_OCP after increasing for a period. In this disclosure, the high-side switch US is turned on during the minimum on time MINTON and the current sensing element 18 does not detect the high-side overcurrent signal HS_OCP, so the high-side overcurrent signal HS_OCP is maintained at low level.

Within time T2, high side current sense function is enabled. The high-side overcurrent detecting element 17 can normally do detection and action. In this disclosure, the inductive current IL is larger than the overcurrent level LEV_OCP, so the high-side overcurrent signal HS_OCP is changed to high level, and it makes the high-side switch US to be turned off, so the inductive current IL starts to decrease. The judging signal MINTON_A is a high-to-low level delay signal for the minimum on time MINTON, and its purpose is to detect immediately whether the inductive current IL is the overcurrent at the ending of the minimum on time MINTON, so that the high-side switch US can be turned off continuously after the inductive current IL is the overcurrent during the minimum on time MINTON, to prevent the inductive current IL from increasing continuously. After the overcurrent judging unit 210 receives the judging signal MINTON_A with high level and the high-side overcurrent signal HS_OCP with high level, the overcurrent judging unit 210 stops the trigger 13 outputting the set signal SET to the control element 16, to prevent the inductive current IL from increasing continuously at the sequential minimum on time MINTON. Within T3, if the counting unit 220 does not finish counting for the predefined time, it means that the counting unit 220 has not finished counting the judging signal MINTON_A for one period, so the overcurrent judging unit 210 still stops the trigger 13 outputting the set signal SET to the control element 16, and it makes the inductive current IL decrease continuously. In this disclosure, the inductive current IL is lower than the overcurrent level LEV_OCP.

Within time T4, the high-side switch US is turned off, so the inductive current IL decreases continuously. In this disclosure, the inductive current IL is lower than the overcurrent level LEV_OCP.

Within time T5, the counting unit 220 finishes counting for the predefined time, so the overcurrent judging unit 210 permits the trigger 13 to output the set signal SET to the control element 16, and the high-side switch US is turned on during the minimum on time MINTON. In this disclosure, the inductive current IL increases continuously and will be larger than the overcurrent level LEV_OCP after increasing for a period, similar to the signal waveform within time T1.

Within time T6, high side current sense function is enabled. The high-side overcurrent detecting element 17 can normally do detection and action. In this disclosure, the inductive current IL is larger than the overcurrent level LEV_OCP, so the high-side overcurrent signal HS_OCP is changed to high level, and it makes the high-side switch US to be turned off, so that the inductive current IL starts to decrease. The judging signal MINTON_A is a high-to-low level delay signal for the minimum on time MINTON, and its purpose is to detect immediately whether the inductive current IL is the overcurrent at the ending of the minimum on time MINTON, so that the high-side switch US can be turned off continuously after the inductive current IL is the overcurrent during the minimum on time MINTON, to prevent the inductive current IL from increasing continuously. After the overcurrent judging unit 210 receives the judging signal MINTON_A with high level and the high-side overcurrent signal HS_OCP with high level, the overcurrent judging unit 210 stops the trigger 13 outputting the set signal SET to the control element 16, to prevent the inductive current IL from increasing continuously at the sequential minimum on time MINTON, similar to the signal waveform of time T2.

In conclusion, after the overcurrent judging unit 210 of the current protection circuit 200 detects the inductive current IL to be overcurrent after the minimum on time MINTON of the high-side switch US, the overcurrent judging unit 210 stops the trigger 13 outputting the set signal SET to the control element 16, making the inductive current IL still decrease continuously during the sequential minimum on time of the high-side switch US. The overcurrent judging unit 210 does not permit the trigger 13 to output the set signal SET to the control element 16 periodically until the counting unit 220 finishes counting. Therefore, compared to the pulse width modulator 10 in prior art which cannot decrease the inductive current IL having the overcurrent when the inductive current IL is the overcurrent during the minimum on time MINTON of the high-side switch US, according to the present disclosure, the pulse width modulator 10 in prior art is added with a current protection circuit 200, which can decrease an inductive current IL when the inductive current IL is the overcurrent during the minimum on time of the high-side switch 200 so that the average current of the inductive current IL does not become too high to damage the pulse width modulator 10.

Figure 5:
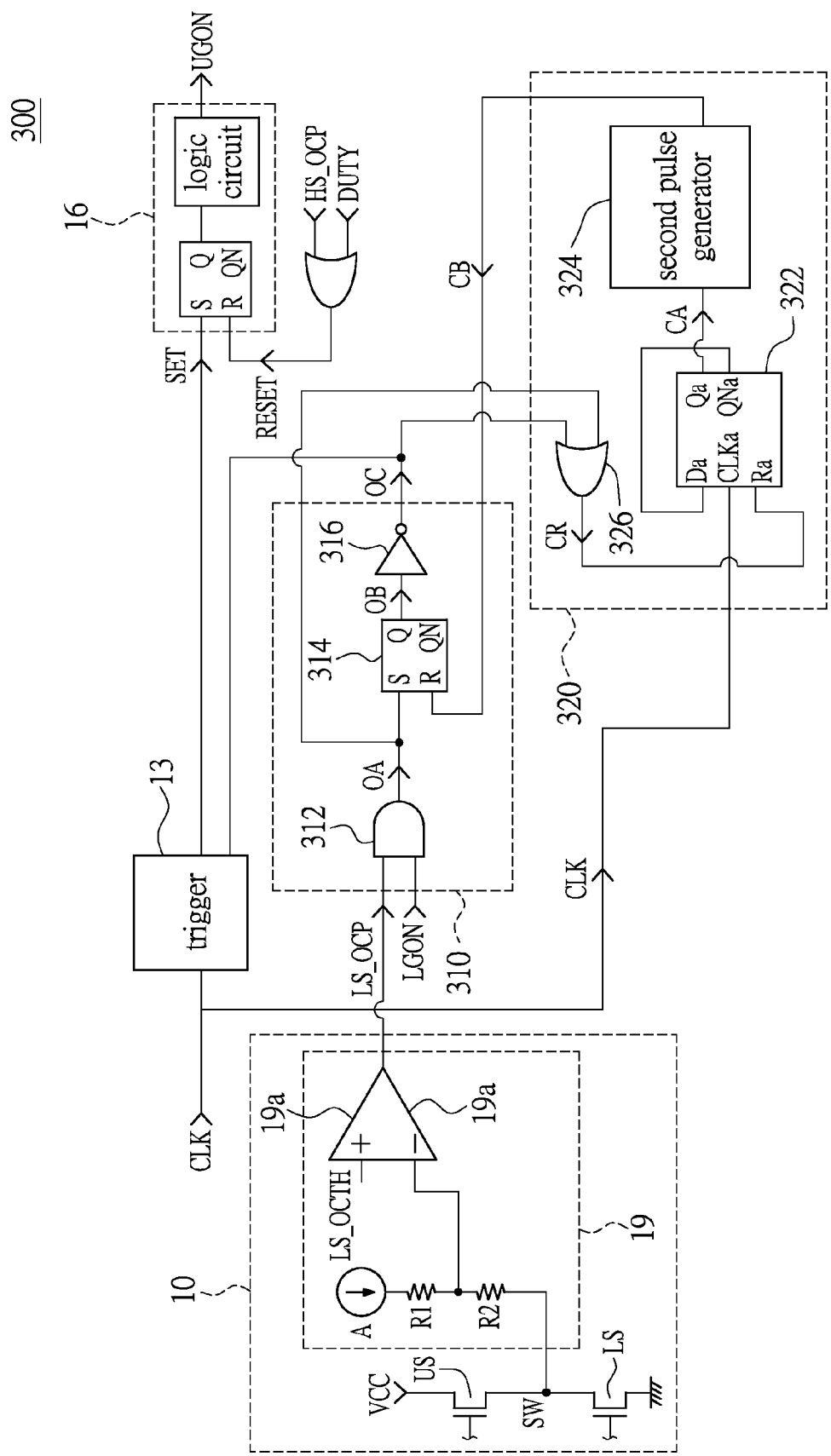
FIG. 5 is a schematic view of another exemplary embodiment of the over-current protection circuit of the present disclosure.

Please refer to FIG. 5 which is a schematic view of another exemplary embodiment of the over-current protection circuit of the present disclosure. Compared with the over-current protection circuit 200 of the above-mentioned exemplary embodiment, the over-current protection circuit 300 of this exemplary embodiment detects whether the inductive current IL flowing through the low-side switch LS is the overcurrent, and turns off the high-side switch for a predefined time to make the inductive current IL decrease continuously when the pulse width modulator 10 judges that the inductive current IL is the overcurrent.

Based on the circuit structure and driving way of the pulse width modulator 10 in prior art, the pulse width modulator 10 further comprises a low-side overcurrent detecting element 19. The low-side overcurrent detecting element 19 comprises a comparator 19a, a first resistor R1, a second resistor R2 and a current source A. One end of the first resistor R1 is connected electrically to the current source A. Another end of the first resistor R1 is connected electrically to one end of the second resistor R2. Another end of the second resistor R2 is connected electrically to the connection node SW. An inverting input end of the comparator 19a is connected electrically between the first resistor R1 and the second resistor R2. A non-inverting input end of the comparator 19a receives an overcurrent threshold LS_OCTH. Therefore, the comparator 19a detects whether the inductive current IL flowing through the low-side switch LG is the overcurrent according to the voltage of the connection node SW and the overcurrent threshold LS_OCTH, and generates a low-side overcurrent signal LS_OCP when the inductive current IL is detected to be the overcurrent. The detect circuit for detecting whether the inductive current IL flowing through the low-side switch LS causes the overcurrent may also be another kind of circuit, and the present disclosure is not limited thereto.

In addition, the connection relationships and operations among the output-stage element 11, the trigger 13 and the driving module of the pulse width modulator 10 are illustrated in the prior art, FIG. 1 and FIG. 2, so their detailed description is omitted. In this exemplary embodiment, the rigger 13 is configured for receiving a clock signal CLK to generate a set signal SET to the control element 16 of the driving module periodically. When the control element 16 receives the set signal SET, the control element 16 generates a high-side turn-on signal UGON indicative of high level to turn on the high-side switch US, so as to make the inductive current IL increase. When the control element 16 receives the reset signal RESET, the control element 16 generates a low-side turn-on signal UGON indicative of low level to turn off the high-side switch US, so as to make the inductive current IL decrease. The control element 16 of the driving module comprises a SR latch and a logic circuit. The SR latch is connected electrically to the logic circuit, and generates a high-side turn-on signal UGON by the logic circuit according to the set signal SET and the reset signal RESET, in order to turn on or turn off the high-side switch US. The trigger 13 may be a positive edge-triggered circuit or a negative edge-triggered circuit. The trigger 13 also may be another kind of trigger, and the present disclosure is not limited thereto.

It is noted that the over-current protection circuit 300 has an overcurrent judging unit 310 and a counting unit 320. The counting unit 320 configured for receiving the clock signal CLK. The overcurrent judging unit 310 is configured for receiving a low-side turn-on signal LGON indicative of turning on the low-side switch and receiving the low-side overcurrent signal LS_OCP, to correspondingly control whether the trigger 13 outputs the set signal SET to the control element 16. When the overcurrent judging unit 310 judges that the inductive current IL to be overcurrent according to low-side turn-on signal LGON and the low-side the overcurrent signal LS_OCP, the overcurrent judging unit 310 stops the trigger 13 outputting the set signal SET to the control element 16, and the counting unit 320 counts for a predefined time according to the clock signal CLK. After the counting unit 320 finishes counting for the predefined time, the overcurrent judging unit 310 permits the trigger 13 to output the set signal SET to the control element 16 periodically.

That is, when the overcurrent judging unit 310 judges that the inductive current IL to be overcurrent according to the low-side turn-on signal LGON and the low-side the overcurrent signal LS_OCP, the overcurrent judging unit 310 will stop the trigger 13 outputting the set signal SET to the control element 16. In this disclosure, the control element 16 outputs a high-side turn-on signal UGON with low level, to turn off the high-side switch US, so as to make the inductive current IL continuously decrease. After the counting unit 320 finishes counting for the predefined time, that is, after the inductive current IL decreases for a predefined time, the overcurrent judging unit 310 permits the trigger 13 to generate the set signal SET to the control element 16 periodically.

In this exemplary embodiment, the overcurrent judging unit 310 comprises an AND gate 312, a latch 314 and a first NOT gate 316. The AND gate 312 receives the low-side turn-on signal LGON and the low-side overcurrent signal LS_OCP to generate an activating signal OA correspondingly. The latch 314 is connected electrically between the AND gate 312 and the first NOT gate 316, to generate a latch signal OB according to the activating signal OA. The first NOT gate 316 receives the latch signal OB to generate an on/off signal OC to the trigger 13 and the counting unit 320, and to control whether the trigger 13 outputs the set signal SET to the control element 16, and to control whether the counting unit 320 starts counting for a predefined time according to the clock signal CLK.

In this exemplary embodiment, the latch 314 is an SR latch. Therefore, when the AND gate 312 receives the low-side turn-on signal LGON with high level and the low-side overcurrent signal LS_OCP with high level, it means that the inductive current IL has the overcurrent, the AND gate 312 generates the activating signal OA with high level to a set end of the low-side the SR latch, to generate a latch signal OB with high level. Next, the first NOT gate 316 inverts the latch signal OB with high level, and outputs the on/off signal OC with low level to the trigger 13 and the counting unit 320. In this disclosure, the trigger 13 outputs the set signal SET to the control element 16, to turn off the high-side switch US, so as to make the inductive current IL continuously decrease. After the counting unit 320 finishes counting for the predefined period, that is, after the inductive current IL decreases for a predefined period, the counting unit 320 transmits signal to a reset end of the SR latch, to make the first NOT gate 316 output the on/off signal OC with high level, to permit the trigger 13 to output the set signal SET to the control element 16 periodically. The latch 314 can also be another kind of latch, such as JK flip-flop, however. The present disclosure is not limited thereto.

The counting way of the counting unit 320 can be designed such that the counting unit 320 outputs a restoring signal CB after waiting for a predefined time, to give notice to the overcurrent judging unit 310 that the counting is terminated; alternatively, the counting way of the counting unit 320 can be designed such that the counting unit 320 outputs the restoring signal CB after counting the judging signal for several periods, to give notice to the overcurrent judging unit 310 that the counting is terminated. The counting unit 320 can be operated in other counting ways, and the present disclosure is not limited thereto. In this exemplary embodiment, after counting the judging signal for one period, the counting unit 320 outputs the restoring signal according to the circuit design, and the detail is described in the following paragraph.

The counting unit 320 comprises a D flip-flop 322, a second pulse generator 324 and an OR gate 326. The D flip-flop 322 has an input end Da, a clock input end CLKa, a reset end Ra, an output end Qa and an inverting output end QNa. As shown in FIG. 5, the clock input end CLKa receives the clock signal CLK. The input end Da is connected electrically to the inverting output end QNa. The output end Qa is connected electrically to the second pulse generator 324. The reset end Ra is connected electrically to the OR gate 326.

According to the connecting relationship between the D flip-flop 322, the second pulse generator 324, and OR gate 326, the OR gate 326 is configured for receiving the activating signal OA and the on/off signal OC, to generate a recount signal CR correspondingly. The clock input end CLKa of the D flip-flop 322 receives the clock signal CLK, and the D flip-flop 322 counts the clock signal CLK for one period according to the recount signal CR and amount of the D flip-flop that is one in this exemplary embodiment, and generates the count terminating signal CA after the D flip-flop 322 finishes counting the clock signal for one period.

The second pulse generator 324 receives the count terminating signal CA, to generate a restoring signal CB to the latch 314 correspondingly. It makes the first NOT gate 316 generate the on/off signal OC to the trigger 13, to permit the trigger 13 to output the set signal SET to the control element 16 periodically, so that the high-side switch US is further controlled to turn on or turn off. In this exemplary embodiment, the amount of the D flip-flop can be adjusted according to practical conditions. If there are two D flip-flops 322, the D flip-flops 322 will generate the count terminating signal CA after finishing counting the clock signal CLK for two periods, however, the present disclosure is not limited thereto.

Figure 6:
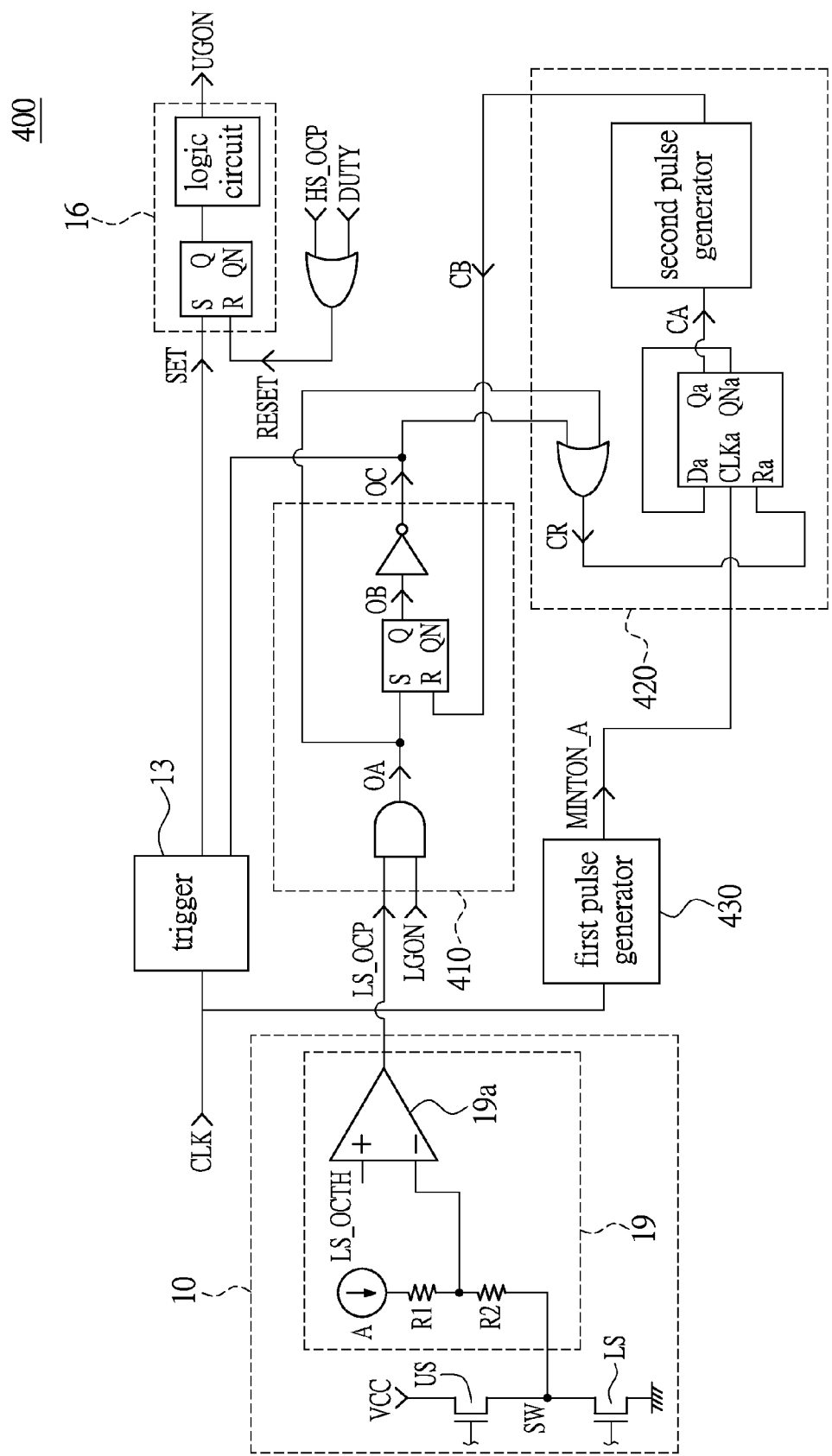
FIG. 6 is a schematic view of another exemplary embodiment of the over-current protection circuit of the present disclosure.

In addition, as shown in FIG. 6, the over-current protection circuit 400 has an overcurrent judging unit 410, a counting unit 420 and a first pulse generator 430. The related structure and connection relationship of the overcurrent judging unit 410 and the counting unit 420 is the same as that of the overcurrent judging unit 310 and the counting unit 320 of the over-current protection circuit 300, so their detailed description is omitted. The difference between the over-current protection circuit 400 and the over-current protection circuit 300 is that the over-current protection circuit 400 further comprises a first pulse generator 430. The first pulse generator 430 is connected electrically to the counting unit 420, and receives the clock signal CLK to generate the judging signal MINTON_A to the counting unit 420 periodically. It makes the counting unit 420 count the judging signal MINTON_A a predefined times according to the clock signal CLK.

Figure 7:
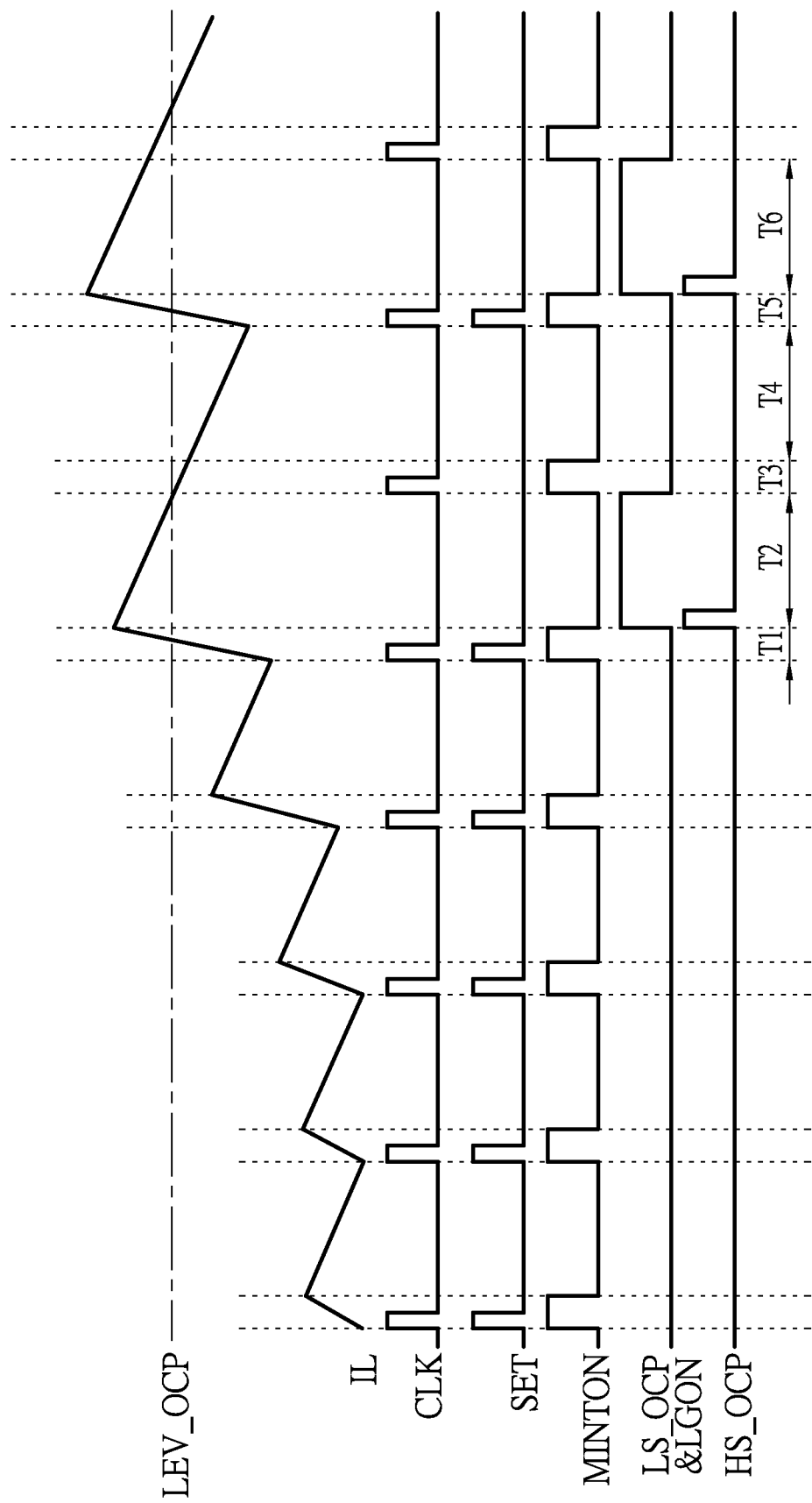
FIG. 7 is a signal waveform of the over-current protection circuit shown in the FIG. 5.

Next, please refer to FIG. 7 which is a waveform of the over-current protection circuit shown in the FIG. 5. As shown in FIG. 7, within time T1, the high-side switch US is turned on during the minimum on time MINTON, so the inductive current IL increases continuously, and will be larger than the overcurrent level LEV_OCP after increasing for a period. In this disclosure, the high-side switch US is turned on during the minimum on time MINTON, so the low-side overcurrent signal LS_OCP and the low-side turn-on signal LGON is maintained at low level. The high-side overcurrent signal HS_OCP is also maintained at low level.

Within time T2, high side current sense function is enabled. The high-side overcurrent detecting element 17 can normally do detection and action. In this disclosure, the inductive current IL is larger than the overcurrent level LEV_OCP, so the high-side overcurrent signal HS_OCP is changed to high level, and it makes the high-side switch US to be turned off, and the low-side switch LS to be turned on, so the inductive current IL starts to decrease. The low-side turn-on signal LGON is changed to high level. In this disclosure, the inductive current IL is larger than the overcurrent level LEV_OCP, so the low-side overcurrent signal LS_OCP is also changed to high level. Therefore, after the overcurrent judging unit 310 receives the low-side overcurrent signal LS_OCP with high level and the low-side turn-on signal LGON with high level, the overcurrent judging unit 310 stops the trigger 13 outputting the set signal SET to the control element 16, to prevent the inductive current IL from increasing continuously at the sequential minimum on time MINTON.

Within T3, the counting unit 320 does not finish counting for the predefined time, which means that the counting unit 320 does not finish counting the clock signal CLK for one period, so the overcurrent judging unit 310 still stops the trigger 13 outputting the set signal SET to the control element 16, so that the inductive current IL decreases continuously. In this disclosure, the inductive current IL is lower than the overcurrent level LEV_OCP.

Within time T4, the high-side switch US is turned off, so the inductive current IL decreases continuously. In this disclosure, the inductive current IL is lower than the overcurrent level LEV_OCP.

Within time T5, the counting unit 320 finishes counting for the predefined time, so the overcurrent judging unit 310 permits the trigger 13 to output the set signal SET to the control element 16, so that the high-side switch US is turned on during the minimum on time MINTON. In this disclosure, the inductive current IL increases continuously and will be larger than the overcurrent level LEV_OCP after increasing for a period, similar to the signal waveform within time T1.

Within time T6, high side current sense function is enabled. The high-side overcurrent detecting element 17 can normally do detection and action. In this disclosure, the inductive current IL is larger than the overcurrent level LEV_OCP, so the high-side overcurrent signal HS_OCP is changed to high level, and it makes the high-side switch US to be turned off, the low-side switch LS to be turned on, so the inductive current IL starts to decrease. The low-side turn-on signal LGON is changed to high level. In that time, the inductive current IL is larger than the overcurrent level LEV_OCP, so the low-side overcurrent signal LS_OCP is also changed to high level. Therefore, after the overcurrent judging unit 310 receives the low-side overcurrent signal LS_OCP with high level and the low-side turn-on signal LGON with high level, the overcurrent judging unit 310 stops the trigger 13 outputting the set signal SET to the control element 16, to prevent the inductive current IL from increasing continuously at the next minimum on time MINTON, similar to the signal waveform within time T2.

In conclusion, after the overcurrent judging unit 310 of the current protection circuit 300 detects the inductive current IL to be overcurrent after the minimum on time MINTON of the high-side switch US, the overcurrent judging unit 310 stops the trigger 13 outputting the set signal SET to the control element 16, so that the inductive current IL still decreases continuously during the sequential minimum on time of the high-side switch US. The overcurrent judging unit 310 does not permit the trigger 13 to output the set signal SET to the control element 16 periodically until the counting unit 320 finishes counting. Therefore, compared to the pulse width modulator 10 in prior art which cannot decrease the inductive current IL which is overcurrent during the minimum on time MINTON of the high-side switch US, according to the present disclosure, the pulse width modulator 10 in prior art includes a current protection circuit 300, which can decrease an inductive current IL when the inductive current IL is the overcurrent during the minimum on time of the high-side switch 200 so that the average current of the inductive current IL does not become too high to damage the pulse width modulator 10.

In summary, the over-current protection circuit and a pulse width modulator having the same provided by the exemplary embodiments of the present disclosure will turn off the high-side switch for a predefined time to continuously decrease an inductive current when the inductive current is the overcurrent during the minimum on time of the high-side switch, so that the average current of the inductive current does not become too high to damage the pulse width modulator.

The above-mentioned descriptions represent merely the exemplary embodiment of the present disclosure, without any intention to limit the scope of the present disclosure thereto. Various equivalent changes, alternations or modifications according to the claims of present disclosure are all consequently viewed as being embraced by the scope of the present disclosure.

What is claimed is:

1. An over-current protection circuit, adapted for a pulse width modulator, the pulse width modulator comprising a trigger, a high-side switch, a low-side switch, a driving module and a control element, the trigger receiving a clock signal and according to the clock signal generating a set signal to the control element periodically, and the high-side switch connected electrically to the low-side switch, the driving module controlling the high-side switch and the low-side switch according to the set signal and a reset signal periodically to adjust an inductive current flowing through the high-side switch and the low-side switch, the control element turning on the high-side switch by at least one minimum on time, and after the minimum on time the driving module detecting whether the inductive current flowing through the high-side switch is larger than an overcurrent level, and generating an overcurrent signal when the inductive current is detected larger than the overcurrent level, the over-current protection circuit comprising:

a first pulse generator, receiving the clock signal to generate a judging signal periodically, and a judging time of the judging signal being larger than the minimum on time;

a counting unit, receiving the judging signal; and an overcurrent judging unit, receiving the judging signal and the overcurrent signal to control whether the trigger outputs the set signal, wherein when the overcurrent judging unit judges the inductive current to be overcurrent according to the judging signal and the overcurrent signal, the overcurrent judging unit stops the trigger outputting the set signal to the driving module, and the counting unit counts for a predefined time according to the judging signal, and the overcurrent judging unit permits the trigger to output the set signal to the driving module periodically after the counting unit finishes counting for the predefined time.

2. The over-current protection circuit according to claim 1, wherein the overcurrent judging unit comprises:

an AND gate, receiving the judging signal and the overcurrent signal to generate an activating signal;

a latch, generating a latch signal according to the activating signal; and a first NOT gate, generating an on/off signal to the trigger and the counting unit according to the latch signal, to control whether the trigger outputs the set signal to the driving module and to control whether the counting unit starts to count for the predefined time according to the judging signal.

3. The over-current protection circuit according to claim 2, wherein the counting unit comprises:
   a second NOT gate, receiving the judging signal to invert the judging signal;
   at least one D flip-flop, receiving the inverted judging signal to count the judging signal according to the on/off signal and the amount of the D flip-flop, and generating a count terminating signal after finishing counting the judging signal; and
   a second pulse generator, receiving the count terminating signal to generate a restoring signal to the latch, so as to enable the first NOT gate to generate the on/off signal to the trigger, so that the trigger is permitted to output the set signal to the driving module periodically.

4. The over-current protection circuit according to claim 1, wherein the counting unit comprises:
   a second NOT gate, receiving the judging signal to invert the judging signal;
   at least one D flip-flop, counting the judging signal according to the amount of the D flip-flop when the overcurrent judging unit stops the trigger outputting the set signal to the driving module, and the D flip-flop generating a count terminating signal after finishing counting the judging signal; and
   a second pulse generator, receiving the count terminating signal to generate a restoring signal to the overcurrent judging unit, to permit the trigger to output the set signal to the driving module periodically.

5. The over-current protection circuit according to claim 1, wherein the trigger is a positive edge-triggered circuit or a negative edge-triggered circuit.

6. A pulse width modulator having over-current protection, comprising:
   a trigger, receiving a clock signal to generate a set signal periodically;
   a high-side switch;
   a low-side switch, connected electrically to the high-side switch;
   a driving module, controlling the high-side switch and the low-side switch according to the set signal and a reset signal periodically to adjust an inductive current flowing through the high-side switch and the low-side switch, wherein the driving module turns on the high-side switch for at least one minimum on time, and after the minimum on time the driving module detects whether the inductive current flowing through the high-side switch is larger than an overcurrent level, and generates an overcurrent signal when the inductive current is detected larger than the overcurrent level; and
   an over-current protection circuit comprising:
   a first pulse generator, receiving the clock signal to generate a judging signal periodically, and a judging time of the judging signal being larger than the minimum on time;
   a counting unit, receiving the judging signal; and
   an overcurrent judging unit, receiving the judging signal and the overcurrent signal to control whether the trigger outputs the set signal, wherein when the overcurrent judging unit judges the inductive current to be overcurrent according to the judging signal and the overcurrent signal, the overcurrent judging unit stops the trigger outputting the set signal to the driving module, and the counting unit counts for a predefined time according to the judging signal, and the overcurrent judging unit permits the trigger to output the set signal to the driving module periodically after the counting unit finishes counting for the predefined time.

7. The pulse width modulator according to claim 6, wherein the overcurrent judging unit comprises:
   an AND gate, receiving the judging signal and the overcurrent signal to generate an activating signal;
   a latch, generating a latch signal according to the activating signal; and
   a first NOT gate, generating an on/off signal to the trigger and the counting unit according to the latch signal, to control whether the trigger outputs the set signal to the driving module and to control whether the counting unit starts to count for the predefined time according to the judging signal.

8. The pulse width modulator according to claim 7, wherein the counting unit comprises:
   a second NOT gate, receiving the judging signal to invert the judging signal;
   at least one D flip-flop, receiving the inverted judging signal to count the judging signal according to the on/off signal and the amount of the D flip-flop, and generating a count terminating signal after finishing counting the judging signal; and
   a second pulse generator, receiving the count terminating signal to generate a restoring signal to the latch, so as to enable the first NOT gate to generate the on/off signal to the trigger, so that the trigger is permitted to output the set signal to the driving module periodically.

9. The pulse width modulator according to claim 6, wherein the counting unit comprises:
   a second NOT gate, receiving the judging signal to invert the judging signal;
   at least one D flip-flop, counting the judging signal according to the amount of the D flip-flop when the overcurrent judging unit stops the trigger outputting the set signal to the driving module, and the D flip-flop generating a count terminating signal after finishing counting the judging signal; and
   a second pulse generator, receiving the count terminating signal to generate a restoring signal to the overcurrent judging unit, to permit the trigger to output the set signal to the driving module periodically.

10. An over-current protection circuit, adapted for a pulse width modulator, the pulse width modulator comprising a trigger, a high-side switch, a low-side switch, and a driving module, the trigger receiving a clock signal and according to the clock signal generating a set signal to the driving module periodically, and the high-side switch connected electrically to the low-side switch, the driving module controlling the high-side switch and the low-side switch according to the set signal and a reset signal periodically to adjust an inductive current flowing through the high-side switch and the low-side switch, the driving module turns on the high-side switch for at least one minimum on time, and after the minimum on time the driving module detecting whether the inductive current flowing through the low-side switch is larger than an overcurrent level, and generating an overcurrent signal when the inductive current is detected larger than the overcurrent level, and the over-current protection circuit comprising:
   a counting unit, receiving the clock signal; and
   an overcurrent judging unit, receiving a low-side turn-on signal indicative of turning on the low-side switch and receiving the overcurrent signal to control whether the trigger outputs the set signal, wherein when the overcurrent judging unit judges the inductive current to be overcurrent according to the low-side turn-on signal and the overcurrent signal, the overcurrent judging unit stops the trigger outputting the set signal to the driving module, and the counting unit counts for a predefined time according to the clock signal, and the overcurrent judging unit permits the trigger to output the set signal to the driving module periodically after the counting unit finishes counting for the predefined time.

11. The over-current protection circuit according to claim 10, wherein the overcurrent judging unit comprises:
an AND gate, receiving the low-side turn-on signal and the overcurrent signal to generate an activating signal;
a latch, generating a latch signal according to the activating signal; and
a first NOT gate, generating an on/off signal to the trigger and the counting unit according to the latch signal, to control whether the trigger outputs the set signal to the driving module and to control whether the counting unit starts to count for the predefined time according to the clock signal.

12. The over-current protection circuit according to claim 11, wherein the counting unit comprises:
an OR gate, receiving the activating signal and the on/off signal to generate a recount signal;
at least one D flip-flop, receiving the clock signal and counting the clock signal according to the recount signal and the amount of the D flip-flop, and generating a count terminating signal after finishing counting the clock signal; and
a second pulse generator, receiving the count terminating signal to generate a restoring signal to the latch, so as to enable the first NOT gate to generate the on/off signal to the trigger, so that the trigger is permitted to output the set signal to the driving module periodically.

13. The over-current protection circuit according to claim 10, wherein the counting unit comprises:
an OR gate, generating a recount signal when the overcurrent judging unit stops the trigger outputting the set signal to the driving module or both of the low-side turn-on signal and the overcurrent signal exist simultaneously;
at least one D flip-flop, receiving the clock signal and counting the clock signal according to the recount signal and the amount of the D flip-flop, and generating a count terminating signal after finishing counting the clock signal; and
a second pulse generator, receiving the count terminating signal to generate a restoring signal to the overcurrent judging unit, to permit the trigger to output the set signal to the driving module periodically.

14. The over-current protection circuit according to claim 10, further comprising a first pulse generator which receives the clock signal to generate a judging signal to the counting unit periodically, wherein when the overcurrent judging unit stops the trigger outputting the set signal to the driving module, the counting unit counts the judging signal by a predefined times according to the clock signal, and the overcurrent judging unit permits the trigger to output the set signal to the driving module after the counting unit finishes counting the predefined times.

15. A pulse width modulator having over-current protection, comprising:
a trigger, receiving a clock signal to generate a set signal periodically;
a high-side switch;
a low-side switch, connected electrically to the high-side switch;
a driving module, controlling the high-side switch and the low-side switch according to the set signal and a reset signal periodically to adjust an inductive current flowing through the high-side switch and the low-side switch, wherein the driving module turns on the high-side switch for at least one minimum on time, and after the minimum on time the driving module detects whether the inductive current flowing through the low-side switch is larger than an overcurrent level, and generates an overcurrent signal when the inductive current flowing through the low-side switch is detected larger than the overcurrent level; and
an over-current protection circuit comprising:
a counting unit, receiving the clock signal; and
an overcurrent judging unit, receiving a low-side turn-on signal indicative of turning on the low-side switch and receiving the overcurrent signal to control whether the trigger outputs the set signal, wherein when the overcurrent judging unit judges the inductive current to be overcurrent according to the low-side turn-on signal and the overcurrent signal, the overcurrent judging unit stops the trigger outputting the set signal to the driving module, and the counting unit counts for a predefined time according to the clock signal, and the overcurrent judging unit permits the trigger to output the set signal to the driving module periodically after the counting unit finishes counting for the predefined time.

16. The pulse width modulator according to claim 15, wherein the overcurrent judging unit comprises:
an AND gate, receiving the low-side turn-on signal and the overcurrent signal to generate an activating signal;
a latch, generating a latch signal according to the activating signal; and
a first NOT gate, generating an on/off signal to the trigger and the counting unit according to the latch signal, to control whether the trigger outputs the set signal to the driving module and to control whether the counting unit starts to count for the predefined time according to the clock signal.

17. The pulse width modulator according to claim 16, wherein the counting unit comprises:
an OR gate, receiving the activating signal and the on/off signal to generate a recount signal;
at least one D flip-flop, receiving the clock signal and counting the clock signal according to the recount signal and the amount of the D flip-flop, and generating a count terminating signal after finishing counting the clock signal; and
a second pulse generator, receiving the count terminating signal to generate a restoring signal to the latch, so as to enable the first NOT gate to generate the on/off signal to the trigger, so that the trigger is permitted to output the set signal.

18. The pulse width modulator according to claim 15, wherein the counting unit comprises:
an OR gate, generating a recount signal when the overcurrent judging unit stops the trigger outputting the set signal to the driving module or both of the low-side turn-on signal and the overcurrent signal exist simultaneously;
at least one D flip-flop, receiving the clock signal and counting the clock signal according to the recount signal and the amount of the D flip-flop, and generating a count terminating signal after finishing counting the clock signal; and a second pulse generator, receiving the count terminating signal to generate a restoring signal to the overcurrent judging unit, to permit the trigger to output the set signal to the driving module.

* * * * *